United States Patent
Yoshimoto et al.

[11] Patent Number: 5,949,307
[45] Date of Patent: Sep. 7, 1999

[54] SURFACE ACOUSTIC WAVE DEVICE HAVING TWO RESONATORS WITH PARTIALLY OVERLAPPING TRANSDUCERS

[75] Inventors: Susumu Yoshimoto; Yasushi Yamamoto, both of Tokyo, Japan

[73] Assignee: NEC Corporation, Tokyo, Japan

[21] Appl. No.: 09/080,721

[22] Filed: May 21, 1998

[30] Foreign Application Priority Data

May 26, 1997 [JP] Japan ..................................... 9-149904

[51] Int. Cl.⁶ ...................................................... H03H 9/64
[52] U.S. Cl. ..................... 333/195; 333/196; 310/313 C; 310/313 D
[58] Field of Search .................................. 333/193–196; 310/313 R, 313 B, 313 C, 313 D

[56] References Cited

U.S. PATENT DOCUMENTS

| | | | |
|---|---|---|---|
| 4,060,777 | 11/1977 | Tiersten et al. | 333/195 X |
| 4,384,264 | 5/1983 | Kadota | 333/193 |
| 4,463,327 | 7/1984 | Suzuki et al. | 333/194 |
| 4,609,891 | 9/1986 | Solie et al. | 333/195 |
| 4,672,339 | 6/1987 | Zibis et al. | 333/194 |
| 4,737,743 | 4/1988 | Solie | 333/153 |
| 4,814,658 | 3/1989 | Suthers et al. | 310/313 D |
| 4,908,542 | 3/1990 | Solie | 310/313 B |
| 5,019,742 | 5/1991 | Suthers et al. | 310/313 C |
| 5,115,216 | 5/1992 | Hikita et al. | 333/195 |
| 5,223,762 | 6/1993 | Masaie et al. | 310/313 D |
| 5,363,073 | 11/1994 | Higgins | 333/195 |
| 5,592,040 | 1/1997 | Yamamoto | 333/195 X |

FOREIGN PATENT DOCUMENTS

| | | | |
|---|---|---|---|
| 0 584 761 | 3/1994 | European Pat. Off. . | |
| 3-132209 | 6/1991 | Japan | 333/194 |
| 3-190314 | 8/1991 | Japan | 333/195 |
| 3-247109 | 11/1991 | Japan . | |
| 4-54011 | 2/1992 | Japan . | |
| 4-207615 | 7/1992 | Japan | 333/195 |
| 4-275711 | 10/1992 | Japan . | |
| 4-373304 | 12/1992 | Japan . | |
| 5-136645 | 6/1993 | Japan . | |
| 6-85605 | 3/1994 | Japan . | |
| 7-58585 | 3/1995 | Japan . | |
| 8-8690 | 1/1996 | Japan . | |

*Primary Examiner*—Robert Pascal
*Assistant Examiner*—Barbara Summons
*Attorney, Agent, or Firm*—Young & Thompson

[57] ABSTRACT

A surface acoustic wave device includes first and second longitudinal mode resonators. The first longitudinal mode resonator has two resonance modes, i.e., a longitudinal mode distributed in the same direction as a propagating direction of a surface acoustic wave (SAW) and a transverse mode distributed in a direction perpendicular to the propagating direction of the SAW. The second longitudinal mode resonator is arranged adjacent to the first resonator in a direction perpendicular to the propagating direction of the SAW, and has two resonance modes, i.e., a longitudinal mode and a transverse mode. The resonance modes of the second longitudinal mode resonator are acoustically coupled to the resonance modes of the first longitudinal mode resonator. The first longitudinal mode resonator has an output Inter-Digital Transducer (IDT) having an interdigital electrode to excite a SAW. The second longitudinal mode resonator has an input IDT having an interdigital electrode to receive the SAW from the output IDT. The interdigital electrodes of the input and output IDTs are arranged adjacent to each other in a direction perpendicular to the propagating direction of the SAW and to partially overlap each other in the same direction as the propagating direction.

13 Claims, 5 Drawing Sheets

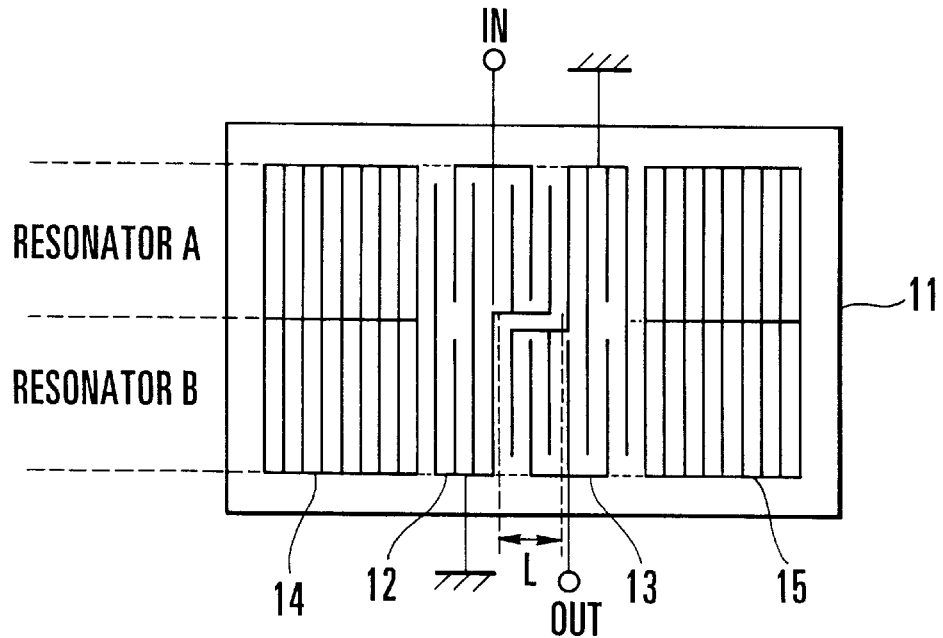
FIG. 1
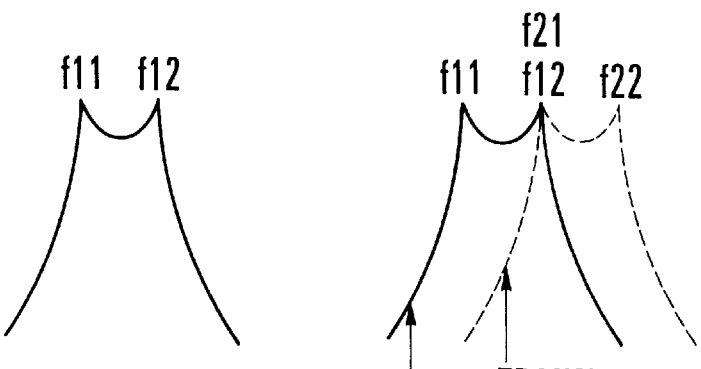
FIG. 2A
FIG. 2B
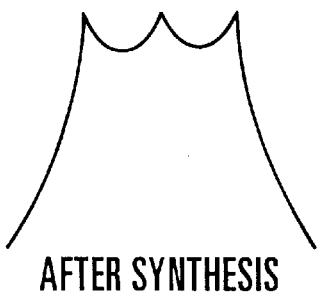
FIG. 2C

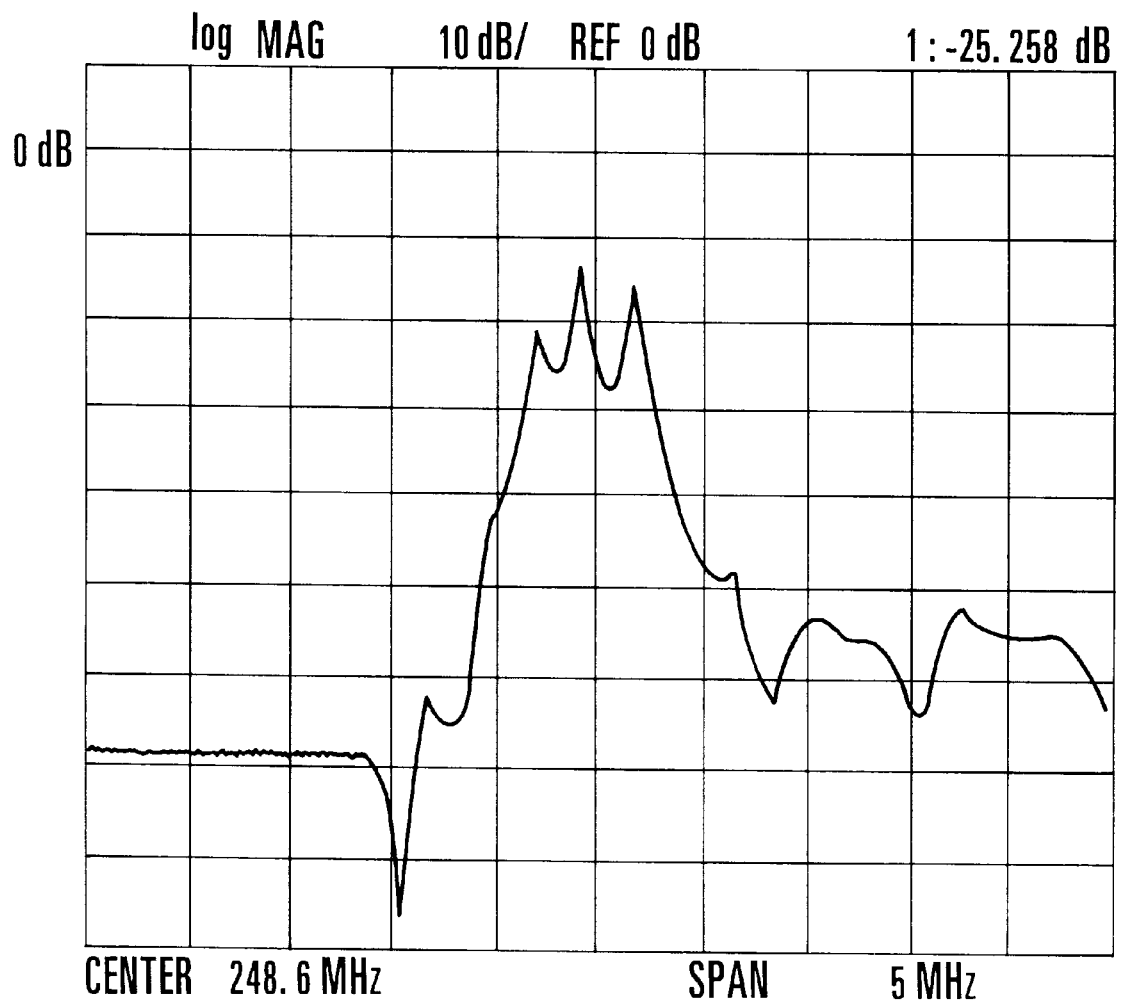
F I G. 3

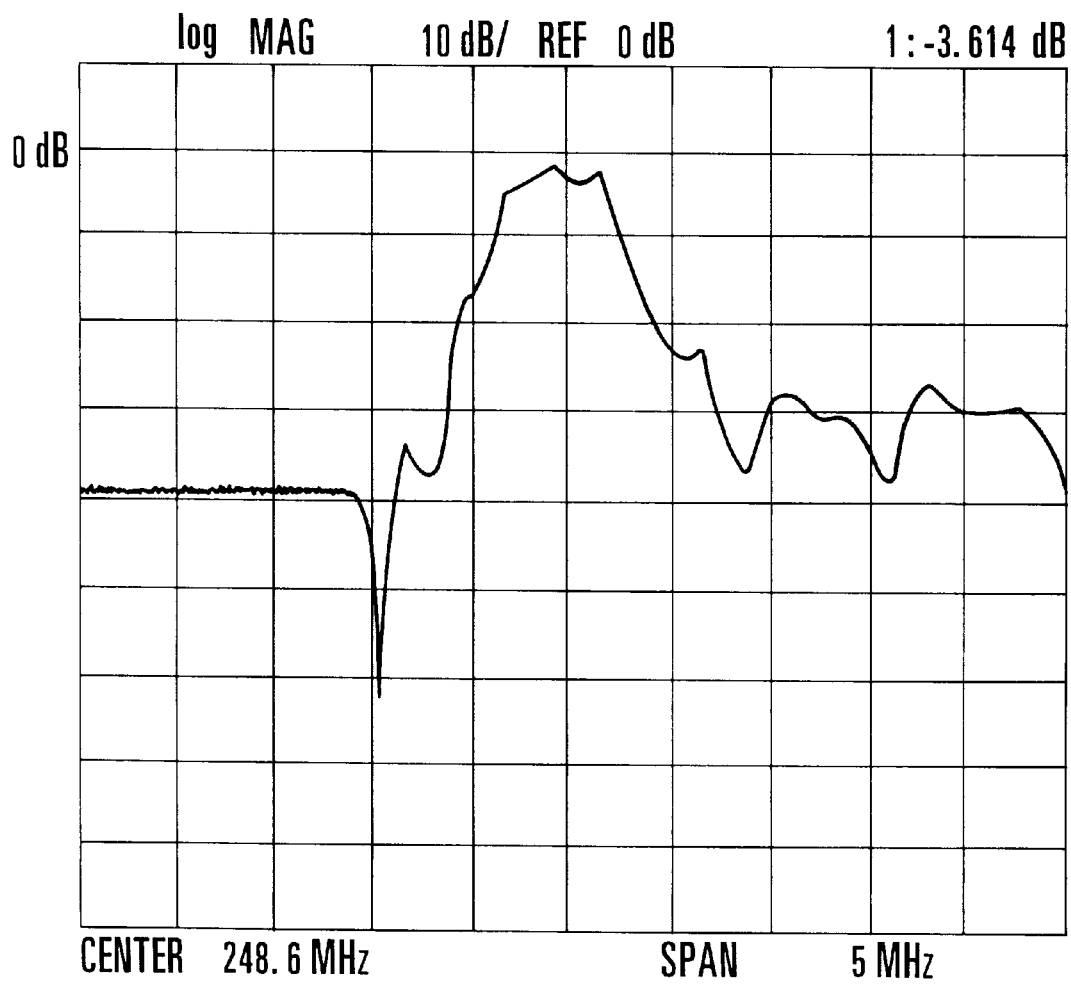
F I G. 4

SURFACE ACOUSTIC WAVE DEVICE HAVING TWO RESONATORS WITH PARTIALLY OVERLAPPING TRANSDUCERS

BACKGROUND OF THE INVENTION

The present invention relates to a surface acoustic wave device that operates within the VHF (Very High Frequency) and UHF (Ultra High Frequency) bands and, more particularly, to the electrode structure of a surface acoustic wave device.

Generally, a Surface Acoustic Wave (SAW) is excited and received by InterDigital Transducers (to be referred to as IDTs hereinafter) formed on a piezoelectric substrate and having interdigital electrodes. Japanese Patent Laid-Open No. 6-232687 (Reference 1) describes a technique for constituting a bandpass filter having wide pass band characteristics by two-dimensionally using two, longitudinal and transverse resonance modes, i.e., resonance caused by the mode distributed in the same direction as the propagating direction of the SAW (this mode will be referred to as the longitudinal mode hereinafter) and resonance caused by the mode distributed in a direction perpendicular to the propagating direction (this mode will be referred to as the transverse mode hereinafter).

FIG. 8 shows a surface acoustic wave filter described in Reference 1. Referring to FIG. 8, the surface acoustic wave filter is constituted by an input IDT 82, an output IDT 83, and grating reflectors 84 and 85 formed on a piezoelectric substrate 81. One half of the input IDT 82 in the direction perpendicular to the propagating direction of the surface acoustic wave serves as the IDT electrode of a resonator A, and the other half thereof serves as a dummy electrode. One half of the output IDT 83 in the direction perpendicular to the propagating direction of the surface acoustic wave serves as a dummy electrode, and the other half thereof serves as the IDT electrode of a resonator B.

In the conventional surface acoustic wave filter described above, the IDT electrodes of the resonators A and B are arranged adjacent to each other not to overlap in a direction (transverse direction) perpendicular to the propagating direction of the surface acoustic wave, in order to effect acoustic coupling of the transverse mode. Since the dummy electrodes are arranged in the same direction as the propagating direction of the surface acoustic wave, the lengths of the respective dummy electrodes in the propagating direction of the surface acoustic wave are equal to the lengths of the IDT electrodes constituting the resonators A and B, respectively. This hinders downsizing of the surface acoustic wave device.

SUMMARY OF THE INVENTION

It is an object of the present invention to provide a surface acoustic wave device whose size in the propagating direction of the surface acoustic wave is reduced to achieve downsizing.

In order to achieve the above object, according to the present invention, there is provided a surface acoustic wave device comprising a first longitudinal mode resonator having two resonance modes including a longitudinal mode distributed in the same direction as a propagating direction of a surface acoustic wave (SAW) and a transverse mode distributed in a direction perpendicular to the propagating direction of the SAW, and a second longitudinal mode resonator arranged adjacent to the first resonator in a direction perpendicular to the propagating direction of the SAW and having two resonance modes including a longitudinal mode and a transverse mode, the resonance modes of the second longitudinal mode resonator being acoustically coupled to the resonance modes of the first longitudinal mode resonator, wherein the first longitudinal mode resonator has an output InterDigital Transducer (IDT) having an interdigital electrode to excite a SAW, the second longitudinal mode resonator has an input IDT having an interdigital electrode to receive the SAW from the output IDT, and the interdigital electrodes of the input and output IDTs are arranged adjacent to each other in a direction perpendicular to the propagating direction of the SAW and to partially overlap each other in the same direction as the propagating direction.

BRIEF DESCRIPTION OF THE DRAWINGS

FIG. 1 is a plan view of a surface acoustic wave device according to the first embodiment of the present invention;

FIGS. 2A, 2B and 2C are resonance frequency graphs to explain the operation of the surface acoustic wave device shown in FIG. 1;

FIG. 3 is an amplitude graph of a surface acoustic wave filter of the present invention measured with a 50-$\Omega$ system;

FIG. 4 is an amplitude graph of the surface acoustic wave filter of the present invention measured after impedance matching;

DESCRIPTION OF THE PREFERRED EMBODIMENTS

The present invention will be described in detail with reference to the accompanying drawings.

FIG. 1 shows a surface acoustic wave device according to the first embodiment of the present invention. Referring to FIG. 1, an input IDT 12 and an output IDT 13 each having a dummy electrode and an interdigital electrode made of metal thin films are formed on a piezoelectric substrate 11. The input IDT 12 and output IDT 13 are arranged to partially overlap by a length L in the propagating direction (the horizontal direction in FIG. 1) of the surface acoustic wave and to be adjacent to each other in a direction (the vertical direction in FIG. 1) perpendicular to the propagating direction of the surface acoustic wave. Grating reflectors 14 and 15 similarly made of metal thin films are formed on the two end sides of the piezoelectric substrate 11 in the propagating direction of the surface acoustic wave to sandwich the IDTs 12 and 13.

The operation of the surface acoustic wave device having the above arrangement will be described with reference to FIGS. 2A to 2C.

An input-side resonator A will be described first. The grating reflector 14, the interdigital electrode of the input IDT 12, the dummy electrode of the output IDT 13, and the grating reflector 15 are sequentially arranged in the propagating direction of the surface acoustic wave. This resonator A alone has no difference from a generally known longitudinal multiplex mode coupling type resonator when seen from the propagating direction of the surface acoustic wave. Therefore, as shown in FIG. 2A, frequency characteristics having resonance peaks f11 and f12 can be obtained.

An output-side resonator B is acoustically coupled (transverse-mode coupled) to the resonator A in a direction perpendicular to the propagating direction of the surface acoustic wave, such that the resonance characteristics of the transverse S0 mode having the resonance peaks f11 and f12 and the resonance characteristics of the transverse A1 mode having resonance peaks f21 and f22 become as shown in FIG. 2B. As a result, frequency characteristics shown in FIG. 2C are obtained as the synthesis output.

More specifically, when a plurality of longitudinal multiplex mode coupling type resonators are arranged adjacent to each other to be parallel to the propagating direction of the surface acoustic wave so that they are acoustically transverse-mode coupled, if the propagating path length of the surface acoustic wave becomes larger than a certain value (several hundred $\lambda$), substantially no change occurs in the distribution of the potential of this transverse mode. In the present invention, the input IDT 12 and output IDT 13 are arranged to partially overlap each other in the propagating direction of the surface acoustic wave by utilizing this phenomenon. Therefore, the size of the surface acoustic wave device can be decreased by the length L corresponding to the length of the overlapping portion.

Figure 5:
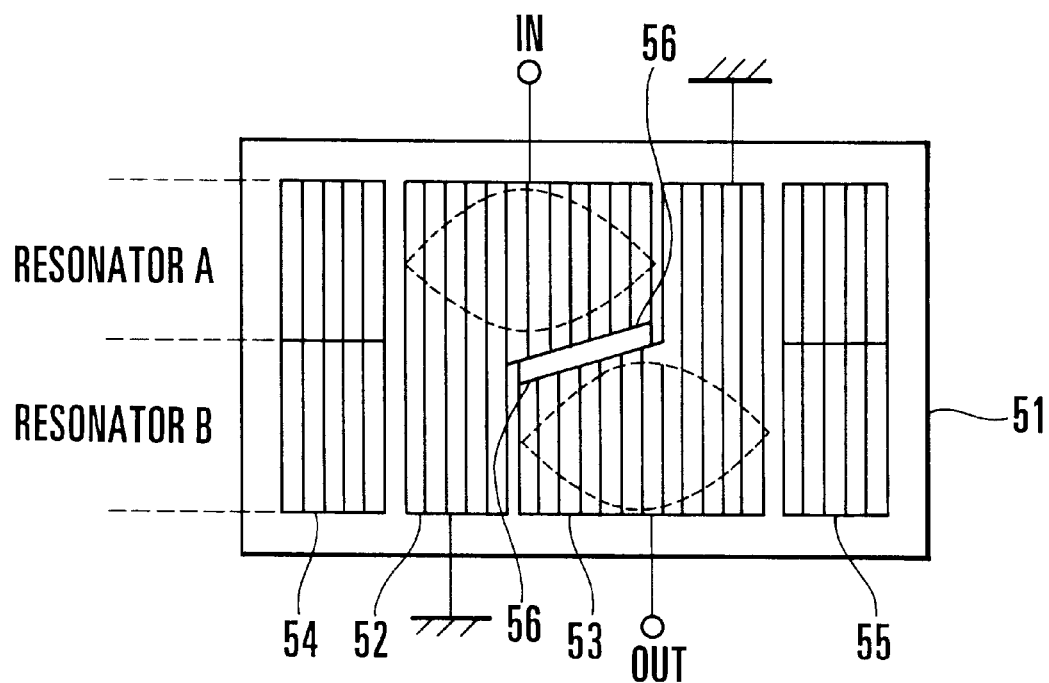
FIG. 5 is a plan view of a surface acoustic wave device according to the second embodiment of the present invention.

FIG. 5 shows a surface acoustic wave device according to the second embodiment of the present invention.

In this embodiment, an input IDT 52 and an output IDT 53 are weighted with an arbitrary function, and an inner bus bar 56 is arranged obliquely in accordance with the weighting function. This weighting realizes a surface acoustic wave filter having desired frequency characteristics. Reference numeral 51 denotes a piezoelectric substrate; and 54 and 55, grating reflectors.

Figure 6:
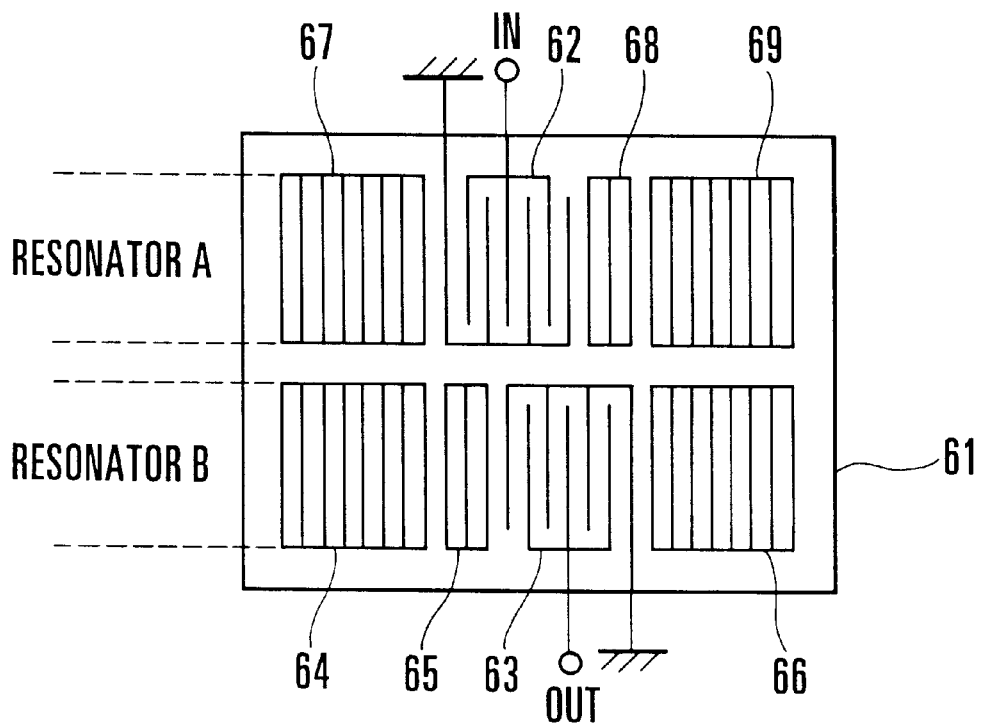
FIG. 6 is a plan view of a surface acoustic wave device according to the third embodiment of the present invention.

FIG. 6 shows a surface acoustic wave according to the third embodiment of the present invention.

In this embodiment, a multiplex longitudinal mode resonator A and a multiplex longitudinal mode resonator B on a substrate 61 are arranged adjacent to each other in a direction perpendicular to the propagating direction of the SAW, such that they are point-symmetrical. The two resonators A and B are electrically completely separated. Dummy electrodes 65 and 68, except an input IDT 62 that excites a surface acoustic wave and an output IDT 63 that receives the surface acoustic wave, and grating reflectors 64, 66, 67, and 69 serve merely acoustically with respect to the respective systems. Hence, this embodiment can realize an operation substantially identical to that of FIG. 1.

Figure 7:
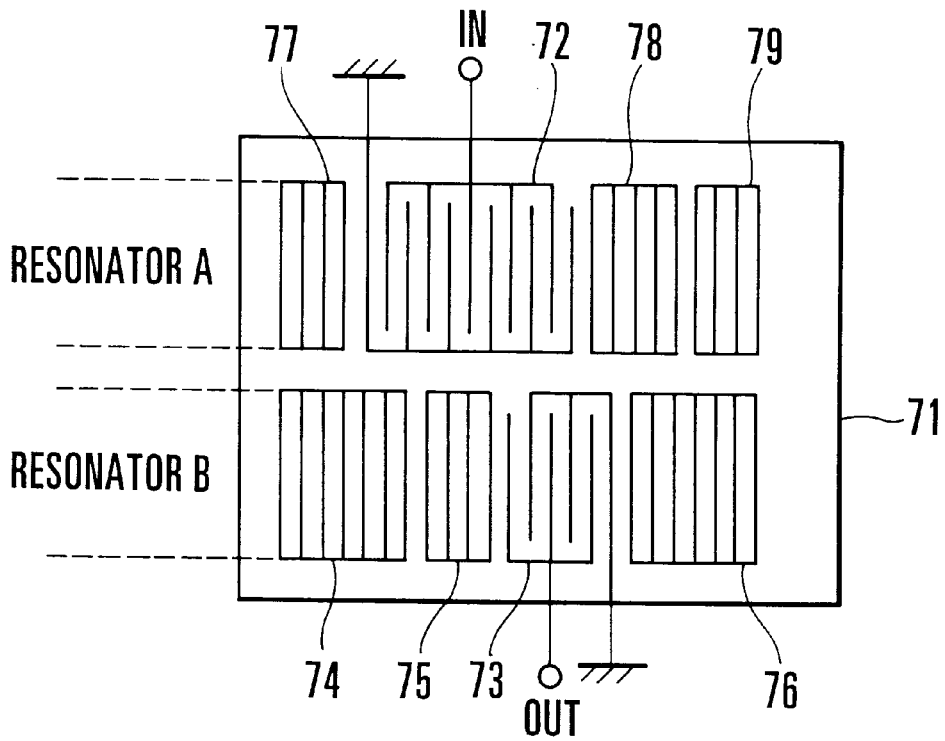
FIG. 7 is a plan view of a surface acoustic wave device according to the fourth embodiment of the present invention.
Figure 8:
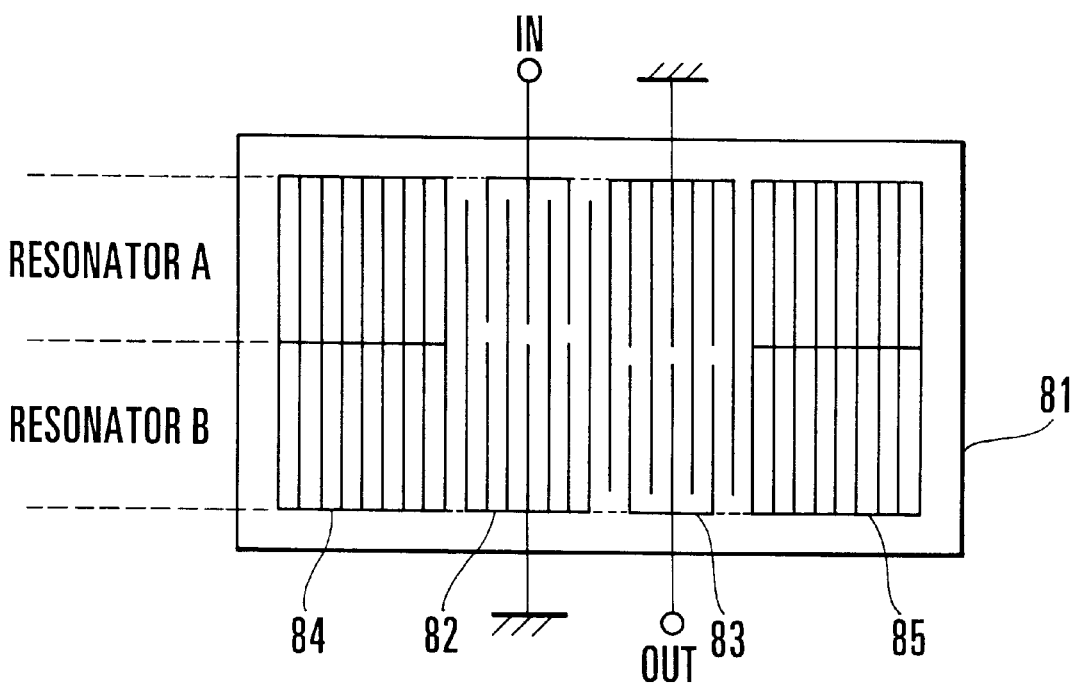
FIG. 8 is a plan view of a conventional surface acoustic wave device.

FIG. 7 shows a surface acoustic wave device according to the fourth embodiment of the present invention.

A multiplex longitudinal mode resonator A and a multiplex longitudinal mode resonator B on a substrate 71 are arranged adjacent to each other in a direction perpendicular to the propagating direction of the SAW, such that they are asymmetrical. The two resonators A and B are electrically completely separated. An input IDT 72 partially overlaps an output IDT 73 in the propagating direction of the surface acoustic wave and partially overlaps an output-side grating reflector 74 as well. In this manner, acoustic synthesis of the asymmetrical longitudinal mode resonators A and B, which cannot be realized in a surface acoustic wave filter in which two longitudinal multiplex mode resonators are transverse-mode coupled, is enabled. FIG. 7 also shows grafting reflectors 76, 77, and 79, and asymmetrical dummy electrodes 75 and 78.

FIG. 3 shows the amplitude frequency of a surface acoustic wave filter of the present invention measured with a 50-$\Omega$ system. The filter used for measurement has a center frequency of about 248.6 MHz and uses a quartz substrate as the piezoelectric substrate. A ratio H/$\lambda$ of a film thickness of the metal thin film forming the input and output IDTs and grating reflectors to the SAW wavelength is 0.015. The number of interdigital electrodes of the input IDT is 391, the number of dummy electrodes of the input IDT is 293, the number of interdigital electrode portions of the output IDT is 391, and the number of dummy electrodes of the output IDT is 293.

The length of a portion where the input and output IDTs partially overlap in the propagating direction of the SAW is about 50 $\lambda$. In this case, when compared to a conventional example in which the input and output IDTs do not overlap, the size of the filter is decreased by 50 $\lambda$(=0.63 mm) corresponding to the overlapping portion of the IDTs.

FIG. 4 shows the frequency of the surface acoustic wave filter of the present invention measured after impedance matching. Referring to FIG. 4, the plurality of resonance peaks of the longitudinal multiplex mode are coupled to the transverse mode, and wide pass band characteristics with a specific band of 0.23% are realized.

As described above, generally, regarding a transverse-mode potential distribution, when the propagating path length of the surface acoustic wave is infinitely long, the mode distribution is uniform within the propagating path. In practice, if this mode distribution has a length almost 100 times the SAW wavelength $\lambda$, it can be approximated as a scalar potential substantially equal to that obtained when the surface acoustic wave propagating path is infinitely long.

The IDTs of the conventionally used longitudinal multiplex mode coupling type surface acoustic wave filter generally have a propagating path length of several hundred $\lambda$. Therefore, even if this propagating path length is decreased to about 50%, the distribution of the transverse mode potential does not substantially change.

In the present invention, the interdigital electrode portions of the input and output IDTs are arranged to partially overlap each other in the propagating direction of the surface acoustic wave within a range not adversely affecting the shape of the potential distribution of the transverse mode, and the number of dummy electrodes corresponding to the overlapping portion is decreased, thereby decreasing the entire length of the surface acoustic wave device.

According to the present invention, the interdigital electrodes of the input and output IDTs are arranged to partially overlap each other with respect to the propagating direction of the surface acoustic wave. Therefore, the length of the surface acoustic wave device can be decreased to be lower than that of a conventional surface acoustic wave device of the same principle in which two longitudinal multiplex mode coupling type resonators are acoustically coupled as they are arranged adjacent to each other to be parallel to the propagating direction of the surface acoustic wave.

What is claimed is:

1. A surface acoustic wave device comprising:
   a first longitudinal mode resonator having two resonance modes including a longitudinal mode distributed in the same direction as a propagating direction of a surface acoustic wave (SAW) and a transverse mode distributed in a direction perpendicular to the propagating direction of the SAW; and
   a second longitudinal mode resonator arranged adjacent to said first resonator in a direction perpendicular to the propagating direction of the SAW and having two resonance modes including a longitudinal mode and a transverse mode, the resonance modes of said second longitudinal mode resonator being acoustically coupled to the resonance modes of said first longitudinal mode resonator, wherein said first longitudinal mode resonator has an output InterDigital Transducer (IDT) having an interdigital electrode to excite a SAW, said second longitudinal mode resonator has an input IDT having an interdigital electrode to receive the SAW from said output IDT, and said interdigital electrodes of said input and output IDTs overlap each other in a direction perpendicular to the propagating direction of the SAW and partially overlap each other in the same direction as the propagating direction.

2. A device according to claim 1, wherein said input IDT has a dummy electrode arranged to oppose said interdigital electrode of said output IDT in the propagating direction of the SAW so as to be adjacent thereto, and said output IDT has a dummy electrode arranged to oppose said interdigital electrode of said input IDT in the propagating direction of the SAW so as to be adjacent thereto.

3. A device according to claim 1, wherein at least one of said input and output IDTs is weighted with an arbitrary function.

4. A device according to claim 1, wherein said input and output IDTs are electrically completely separated from each other.

5. A device according to claim 1, further comprising a pair of grating reflectors to sandwich said input and output IDTs in the propagating direction of the SAW.

6. A device according to claim 1, wherein said first and second longitudinal mode resonators are formed point-symmetrically on a piezoelectric substrate.

7. A device according to claim 1, wherein said first and second longitudinal mode resonators are formed asymmetrically on a piezoelectric substrate.

8. A device according to claim 1, wherein said device further comprises a pair of first grating reflectors sandwiching said input IDT in the propagating direction of the SAW, and a pair of second grating reflectors sandwiching said output IDT in the propagating direction of the SAW, said input IDT is arranged to partially overlap said output IDT in the propagating direction of the surface acoustic wave and to partially overlap one of said second grating reflectors, and said output IDT is arranged to partially overlap said input IDT in the propagating direction of the surface acoustic wave and to partially overlap one of said first grating reflectors.

9. A surface acoustic wave device comprising:

a first longitudinal mode resonator having two resonance modes including a longitudinal mode distributed in the same direction as a propagating direction of a surface acoustic wave (SAW) and a transverse mode distributed in a direction perpendicular to the propagating direction of the SAW; and a second longitudinal mode resonator adjacent to said first resonator in a direction perpendicular to the propagating direction of the SAW and having two resonance modes including a longitudinal mode and a transverse mode, the resonance modes of said second longitudinal mode resonator being acoustically coupled to the resonance modes of said first longitudinal mode resonator;

wherein said first longitudinal mode resonator has an output InterDigital Transducer (IDT) having an interdigital electrode to excite a SAW;

said second longitudinal mode resonator has an input IDT having an interdigital electrode to receive the SAW from said output IDT;

said interdigital electrodes of said input and output IDTs are adjacent to each other in a direction perpendicular to the propagating direction of the SAW and partially overlap each other in the same direction as the propagating direction; and said first and second longitudinal mode resonators are formed asymmetrically on a piezoelectric substrate.

10. A device according to claim 9, wherein said device further comprises;

a pair of first grating reflectors sandwiching said input IDT in the propagating direction of the SAW, and a pair of second grating reflectors sandwiching said output IDT in the propagating direction of the SAW; and wherein said input IDT partially overlaps said output IDT in the propagating direction of the surface acoustic wave and partially overlaps one of said second grating reflectors, and said output IDT partially overlaps said input IDT in the propagating direction of the surface acoustic wave and partially overlaps one of said first grating reflectors.

11. A surface acoustic wave device comprising:

a first longitudinal mode resonator having two resonance modes including a longitudinal mode distributed in the same direction as a propagating direction of a surface acoustic wave (SAW) and a transverse mode distributed in a direction perpendicular to the propagating direction of the SAW; and a second longitudinal mode resonator adjacent to said first resonator in a direction perpendicular to the propagating direction of the SAW and having two resonance modes including a longitudinal mode and a transverse mode, the resonance modes of said second longitudinal mode resonator being acoustically coupled to the resonance modes of said first longitudinal mode resonator;

wherein said first longitudinal mode resonator has an output InterDigital Transducer (IDT) having an interdigital electrode to excite a SAW;

said second longitudinal mode resonator has an input IDT having an interdigital electrode to receive the SAW from said output IDT;

said interdigital electrodes of said input and output IDTs are adjacent to each other in a direction perpendicular to the propagating direction of the SAW and partially overlap each other in the same direction as the propagating direction; and at least one of said input and output IDTs is weighted with an arbitrary function.

12. A device according to claim 11, wherein said device further comprises;

a pair of first grating reflectors sandwiching said input IDT in the propagating direction of the SAW, and a pair of second grating reflectors sandwiching said output IDT in the propagating direction of the SAW; and wherein said input IDT partially overlaps said output IDT in the propagating direction of the surface acoustic wave and partially overlaps one of said second grating reflectors, and said output IDT partially overlaps said input IDT in the propagating direction of the surface acoustic wave and partially overlaps one of said first grating reflectors.

13. A surface acoustic wave device comprising:

a first longitudinal mode resonator having two resonance modes including a longitudinal mode distributed in the same direction as a propagating direction of a surface acoustic wave (SAW) and a transverse mode distributed in a direction perpendicular to the propagating direction of the SAW; and a second longitudinal mode resonator adjacent to said first resonator in a direction perpendicular to the propagating direction of the SAW and having two resonance modes including a longitudinal mode and a transverse mode, the resonance modes of said second longitudinal mode resonator being acoustically coupled to the resonance modes of said first longitudinal mode resonator;

wherein said first longitudinal mode resonator has an output InterDigital Transducer (IDT) having an interdigital electrode to excite a SAW;

said second longitudinal mode resonator has an input IDT having an interdigital electrode to receive the SAW from said output IDT;

said interdigital electrodes of said input and output IDTs are adjacent to each other in a direction perpendicular to the propagating direction of the SAW and partially overlap each other in the same direction as the propagating direction;

said input IDT has a dummy electrode opposing said interdigital electrode of said output IDT in the propagating direction of the SAW so as to be adjacent thereto; and said output IDT has a dummy electrode opposing said interdigital electrode of said input IDT in the propagating direction of the SAW so as to be adjacent thereto.

* * * * *